United States Patent [19]

Kimata

[11] Patent Number: 4,808,834
[45] Date of Patent: Feb. 28, 1989

[54] SOLID-STATE IMAGE SENSOR

[75] Inventor: Masafumi Kimata, Hyogo, Japan

[73] Assignee: Mitsubishi Denki Kabushiki Kaisha, Tokyo, Japan

[21] Appl. No.: 20,194

[22] Filed: Feb. 26, 1987

[30] Foreign Application Priority Data

Feb. 26, 1986 [JP] Japan .................................. 61-41285

[51] Int. Cl.$^4$ ............................................. H01J 40/14
[52] U.S. Cl. .................................. 250/578; 358/213.11; 357/30
[58] Field of Search ............... 250/578, 211 J, 211 R; 357/30 G, 30 H, 24 RL; 358/213.11, 213.23

[56] References Cited

U.S. PATENT DOCUMENTS 4,651,015  3/1987  Nishizawa et al. .................. 250/578
4,678,938  7/1987  Nakamura ........................... 250/578

FOREIGN PATENT DOCUMENTS

3329095A1  8/1983  Fed. Rep. of Germany.
3345147A1 12/1983  Fed. Rep. of Germany.

OTHER PUBLICATIONS

ISSCC, Technical Digest, 1985, pp. 100-101, "A 480×400 Element Image Sensor with a Charge Sweep Device" by M. Kimata et al.
"A New Organization Area Image Sensor With CCD Readout Through Charge Priming Transfer", Sumio Terakawa et al., IEEE Electron Device Leters, vol. EDL-1, No. 5, May 1980, pp. 86-88.

Primary Examiner—Edward P. Westin
Assistant Examiner—Khaled Shami
Attorney, Agent, or Firm—Lowe, Price, LeBlanc, Becker & Shur

[57] ABSTRACT

A CSD type solid-state image sensor comprises an n-type semiconductor substrate (10), p-type impurity regions (20, 30, 40) formed thereon spaced apart from each other, a photodetector portion (21) formed on the p-type impurity region (20), a transfer gate selecting circuit (700) formed on the p-type impurity region (30) and a vertical charge transfer device driving circuit (800) formed on the p-type impurity region (40). The photodetector portion (21) comprises a photodetector (101), a transfer gate (7) and a vertical charge transfer device (8), and the transfer gate (7) and the vertical charge transfer device (8) have a common gate electrode (201). The potential in the p-type impurity region (20) is set to $-V_{PW}$ by a power supply (50), while the potential in the p-type impurity regions (30, 40) is set to $-V_{SW}(V_{PW}<V_{SW})$ by a power supply (60). The voltage at an "L" level of a driving signal applied from the vertical charge transfer device driving circuit (800) to the gate electrode (201) is negative by $|V_{SW}-V_{PW}|$, so that an absolute value of the voltage at an "H" level can be reduced. Thus, an absolute value of the threshold voltage of the transfer gate (7) can also be set to be smaller.

9 Claims, 3 Drawing Sheets

SOLID-STATE IMAGE SENSOR

BACKGROUND OF THE INVENTION

1. Field of the Invention

The present invention relates to a solid-state image sensor, and more particularly, it relates to a solid-state image sensor in which a driver circuit portion for transfer gates and charge transfer devices and a photodetector portion are integrated on the single common semiconductor substrate.

2. Description of the Prior Art

In a conventional CCD (Charge Coupled Device) type solid-stat image sensor, a circuit portion for driving transfer gates and CCDs and a photodetector portion are not integrated on the single common semiconductor substrate. However, a solid-state image sensor such as a CSD (Charge Sweep Device) type solid-state image sensor in which a driver circuit portion for transfer gates and vertical charge transfer devices and a photodetector portion are integrated on the single common semiconductor substrate has been developed in these days. Such a CSD type solid-state image sensor is disclosed in a article by M. Kimata et al., entitled "A 480×400 Element Image Sensor with a Charge Sweep Device", IEEE International Solid-State Circuits Conference, Technical Digest, 1985, pp. 100–101; and U.S. Pat. No. 4,581,539.

FIG. 1 is a schematic plan view showing a structure of such a conventional CSD type solid-state image sensor.

A structure of the CSD type solid-state image sensor shown in FIG. 1 is now described.

In FIG. 1, photodetectors 101-103, 111-113 and 121-123, and gate electrodes 201-203, 211-213 and 221-223 for transfer gates (not shown) and vertical charge transfer devices (not shown) are arranged in row and column directions in a two-dimensional manner.

A transfer gate selecting circuit 700 is arranged on one side of an array comprising the photodetectors and the gate electrodes, and a vertical charge transfer device driving circuit 800 is arranged on the other side thereof. The transfer gate selecting circuit 700 and the vertical charge transfer device driving circuit 800 are connected to the gate electrodes 201-203, 211-213 and 221-223, respectively. The transfer gate selecting circuit 700 provides a transfer gate selecting]g signal for selecting a predetermined transfer gate. The vertical charge transfer device driving circuit 800 provides a vertical charge transfer device driving signal for driving a vertical charge transfer device.

In addition, storage gates 300, 310 and 320 for temporarily storing signal charges from the vertical charge transfer devices are linearly arranged on a further side of the array comprising the photodetectors and the gate electrodes (on the lower side of the array in FIG. 1). Storage control gates 400, 410 and 420 are linearly arranged on the still lower side of the array of the storage gates. Furthermore, a horizontal CCD 500 and an output preamplifier 600 are arranged on the lower side of the array of the storage control gates. The storage control gates 400, 410 and 420 control transfer of signal charges from the storage gates 300, 310 and 320 to the horizontal CCD 500. A photodetector portion comprises the photodetectors 101-103, 111-113 and 121-123, the gate electrodes 201-203, 211-213 and 221-223, transfer gates (not shown), vertical charge transfer devices (not shown), the storage gates 300, 310 and 320, the storage control gates 400, 410 and 420, the vertical CCD 500 and the output preamplifier 600. On the other hand, a driver circuit portion comprises the transfer gate selecting circuit 700 and the vertical charge transfer device driving circuit 800. The photodetector portion and the driver circuit portion are formed on the single common semiconductor substrate.

FIG. 2 is a cross sectional view of one pixel of the CSD type solid-state image sensor shown in FIG. 1. In FIG. 2, a thick oxide film 2 for isolating elements is formed on a p-type semiconductor substrate 1. An n-type impurity region 6 is formed in a region on the p-type semiconductor substrate 1, defined by the oxide film 2. The p-type semiconductor substrate 1 and the n-type impurity region 6 constitute the photodetector 101 having pn junction formed therebetween. In addition, an n-type impurity region 3 is formed on the p-type semiconductor substrate 1, and a p+-type impurity region 4 is formed on the p-type semiconductor substrate 1 between the n-type impurity regions 3 and 6. Furthermore, a gate oxide film 5 is formed on the n-type impurity region 3, the p+-type impurity region 4 and the n-type impurity region 6, and the gate electrode 201 is formed on the portion on the gate oxide film 5, extending over the n-type impurity region 3 and the p+-type impurity region 4. The p+-type impurity region 4, the gate oxide film 5 and the gate electrode 201 constitute a transfer gate 7. A channel of a desired potential is formed on the p+-type impurity region 4 immediately under the gate insulator film 5, in accordance with a transfer gate selecting signal applied to the gate electrode 201 from the transfer gate selecting circuit 700 (FIG. 1), so that the transfer gate 7 reads out signal charges from the photodetector 101. On the other hand, the n-type impurity region 3, the gate oxide film 5 and the gate electrode 201 constitute a vertical charge transfer device 8. A transfer channel of a desired potential is formed in a part of the n-type impurity region 3, in accordance with a vertical charge transfer device driving signal applied to the gate electrode 201 from the vertical charge transfer device driving circuit 800 (FIG. 1), so that the vertical charge transfer device 8 receives signal charges from a transfer gate and transfers the signal charges in a predetermined direction (in a vertical direction).

FIG. 3 is a diagram showing change in channel potential of the transfer gate 7 and the vertical charge transfer device 8 when the voltage (the gate voltage) applied to the gate electrode 201 is changed in a conventional CSD type solid-state image sensor having the structure shown in FIG. 2.

Referring now to FIG. 3, operation of the conventional CSD type solid-state image sensor shown in FIG. 2 is described. Since basic operation of the entire CSD type solid-state image sensor is described in detail in the above described document, it is omitted except for operation of read-out of signal charges from a photodetector related to the present invention.

In FIG. 3, $\phi_{OF}$ is a potential on the photodetector 101 when an overflow drain, if any, for removing excess charges of the photodetector 101 operates.

When signal charges are transferred in the vertical charge transfer device 8, the voltage applied to the gate electrode 201 changes between $V_{G1}$ and $V_{G2}$. Correspondingly, the potential of a transfer channel formed in a part of the n-type impurity region 3 for the vertical charge transfer device 8 changes between $\phi_{C1}$ and $\phi_{C2}$.

Since a photodetector portion and a driver circuit portion are formed on the single common p-type semiconductor substrate 1 and hence the substrate potentials of the driver circuit portion and the photodetector portion are equal, the gate potential $V_{G1}$ can be lowered only to the substrate potentials (0V in this case) at minimum. When the gate voltage is between $V_{G1}$ and $V_{G2}$, the transfer gate 7 is always turned "off", so that signal charges are not read out into the vertical charge transfer device 8 from the photodetector 101. Signal charges are read out from the photodetector 101 by raising the gate voltage to $V_{G3}$ which is higher than $V_{G2}$. The channel potential of the vertical charge transfer device 8 becomes $\phi_{C3}$, and the channel potential of the transfer gate 7 becomes $\phi_{T3}$, so that the potential of the photodetector 101 is reset to $\phi_{T3}$.

Since a conventional CSD type solid-state image sensor is constructed as described above, there exist following disadvantages. More particularly, in order that signal charges may not be read out from the photodetector 101 when signal charges are transferred in the vertical charge transfer device 8, the threshold voltage of the transfer gate 7 must be higher than the voltage at an "H" level of a vertical charge transfer device driving signal In addition, in order that signal charges may be sufficiently read out from the photodetector 101 by turning the transfer gate 7 "on", the voltage of a transfer gate selecting signal must be made very high.

SUMMARY OF THE INVENTION

Briefly stated, the present invention provides a solid-state image sensor comprising a semiconductor substrate of a first conductivity type, at least one first semiconductor region of a second conductivity type opposite to the first conductivity type, formed on the semiconductor substrate, and a photodetector portion formed on the first semiconductor region, the photodetector portion including at least a plurality of photodetectors arranged in row and column directions in a two-dimensional manner for detecting light and generating signal charges, a plurality of transfer gates arranged in row and column directions in a two-dimensional manner and connected to the photodetectors, respectively, for selectively reading out signal charges from the photodetectors, a plurality of vertical charge transfer devices connected to each column of the transfer gates, respectively, for transferring signal charges provided from the transfer gates, and a horizontal charge transfer device connected to the vertical charge transfer devices for transferring signal charges from the vertical charge transfer devices, and further comprising a second semiconductor region of the second conductivity type formed on the semiconductor substrate, spaced apart from the first semiconductor region, a driver circuit portion formed on the second semiconductor region for driving the transfer gates and the vertical charge transfer devices, first power supply means for setting the potential in the first semiconductor region to a first potential, second power supply means for setting the potential in the second semiconductor region to a second potential having the same polarity as that of the first potential and an absolute value which is larger than that of the first potential.

In accordance with another aspect of the present invention, the driver circuit portion comprises a transfer gate selecting circuit for generating a transfer gate selecting signal for selecting a predetermined transfer gate, and a vertical charge transfer device driving circuit for generating a vertical charge transfer device driving signal.

Furthermore, in accordance with another aspect of the present invention, each of the transfer gates and each of the vertical charge transfer devices have a common gate electrode for receiving the transfer gate selecting signal and the vertical charge transfer device driving signal.

Additionally, in accordance with another aspect of the present invention, with respect to a third potential, which is a reference potential, displaced from the ground potential by an absolute value of difference between the first potential and the second potential, the vertical charge transfer device driving signal fluctuates with a first amplitude in a direction opposite to the displacement direction, while a transfer gate selecting signal fluctuates with a second amplitude which is larger than the first amplitude, with respect to the third potential, which is a reference potential.

Accordingly, a primary object of the present invention is to provide a solid-state image sensor capable of driving at a low voltage the transfer gates for reading out signal charges from the photodetectors.

A principal advantage of the present invention is that an absolute value of the voltage level when the vertical charge transfer devices are driven can be reduced while sufficiently maintaining the voltage amplitude of the vertical charge transfer device driving signal.

Another advantage of the present invention is that an absolute value of the threshold voltage of the transfer gates can be set to be small, and an absolute value of the voltage of the transfer gate selecting signal can be reduced.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 4:
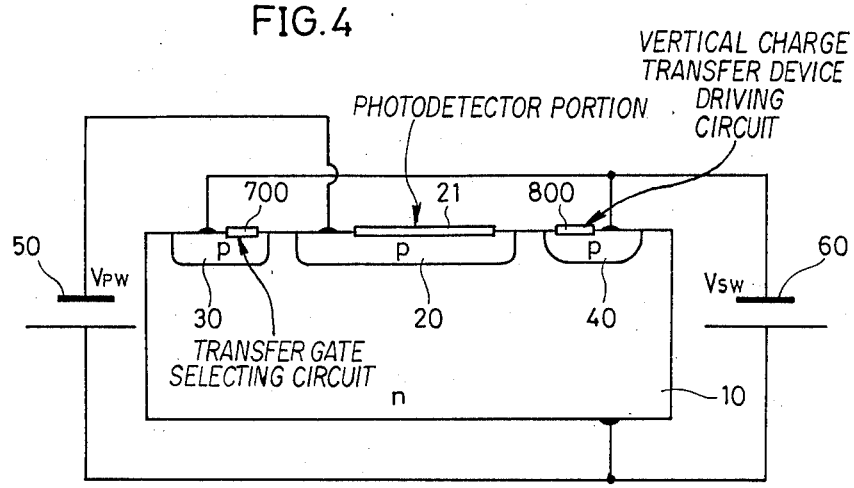
FIG. 4 is a cross sectional view showing a structure of a CSD type solid-state image sensor according to an embodiment of the present invention.

FIG. 4 is a cross sectional view showing a structure of a CSD type solid-state image sensor according to an embodiment of the present invention.

The structure of the solid-state image sensor shown in FIG. 4 is now described.

In FIG. 4, p-type impurity regions 20, 30 and 40 are formed on an n-type semiconductor substrate 10, spaced apart from each other. A power supply of voltage $V_{PW}$ 50 for a photodetector portion is connected between the p-type impurity region 20 and the n-type semiconductor substrate 10. The power supply 50 for the photodetector portion applies a reverse bias between the p-type impurity region 20 and the n-type semiconductor substrate 10 so that the potential in the p-type impurity region 20 is set to $-V_{PW}$. On the other hand, a power supply of voltage $V_{SW}$ ($V_{PW} < V_{SW}$) 60 for a driver circuit portion is connected between the p-type impurity regions 30 and 40 and the n-type semiconductor substrate 10. The power supply 60 for the driver circuit portion applies a reverse bias between the p-type impurity regions 30 and 40 and the n-type semiconductor substrate 10 so that the potentials in the p-type impurity regions 30 and 40 are set to $-V_{SW}$.

Figure 1:
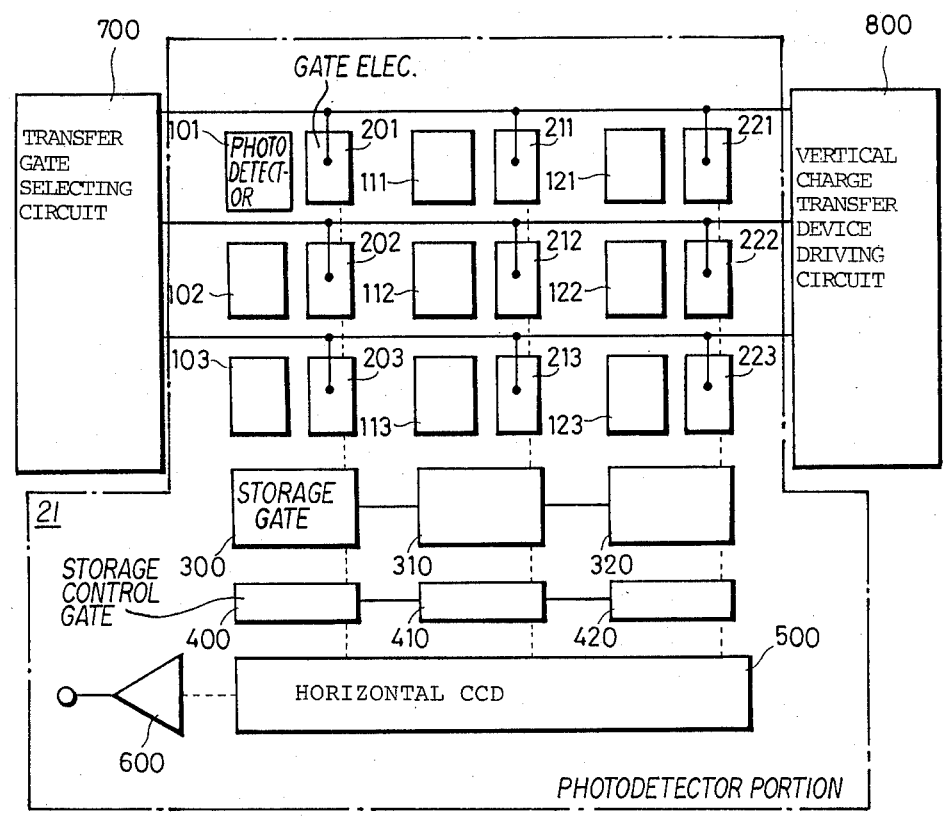
FIG. 1 is a schematic plan view showing a structure of a conventional CSD type solid-state image sensor.
Figure 2:
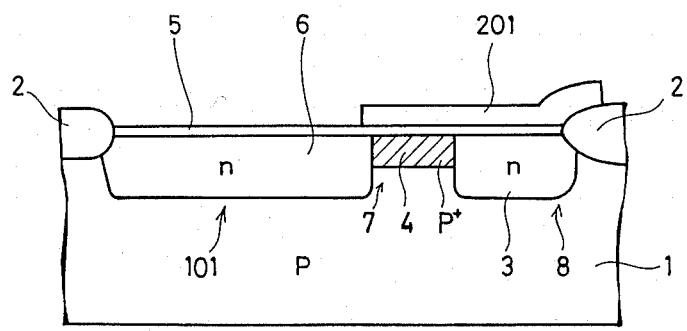
FIG. 2 is a cross sectional view of one pixel of the conventional CSD type solid-state image sensor shown in FIG. 1.

In addition, a photodetector portion 21 is formed on the p-type semiconductor region 20. The photodetector portion 21 comprises photodetectors 101-103, 111-113 and 121-123, transfer gates and vertical charge transfer devices shared with each of the gate electrodes 201-203, 211-213 and 221-223, storage gates 300, 310 and 320, storage control gates 400, 410 and 420, a horizontal CCD 500 and an output preamplifier 600, as shown in FIG. 1.

Furthermore, a transfer gate selecting circuit 700 is formed in the p-type impurity region 30, and a vertical charge transfer device driving circuit 800 is formed in the p-type impurity region 40. The transfer gate selecting circuit 700 and the vertical charge transfer device driving circuit 800 constitute the driver circuit portion as described in FIG. 1.

Figure 5:
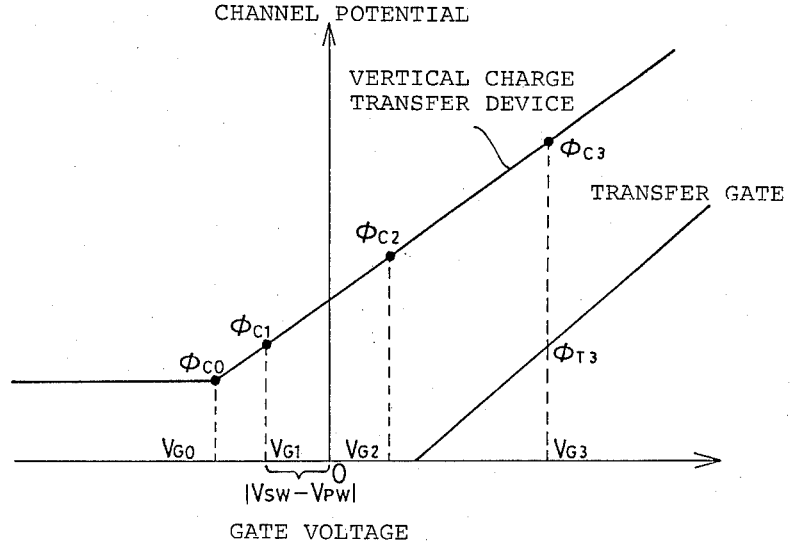
FIG. 5 is a diagram showing change in channel potential of a transfer gate and a vertical charge transfer device when the gate voltage is changed in the CSD type solid-state image sensor according to an embodiment of the present invention.

FIG. 5 is a diagram showing change in channel potential of a transfer gate and a vertical charge transfer device when the gate voltage is changed in the CSD type solid-state image sensor according to an embodiment of the present invention.

Referring now to FIG. 5, operation of the CSD type solid-state image sensor according to an embodiment of the present invention is described. For simplicity of illustration, operation is described with respect to the photodetector 101 in the following.

In FIG. 4, since a driver circuit portion is formed of n channel MOS circuits on the p-type impurity regions 30 and 40, the minimum level of voltages of a transfer gate selecting signal and a vertical charge transfer device driving signal is set to the potential in the p-type impurity regions 30 and 40. With $|V_{PW}| < |V_{SW}|$, the voltage at an "L" level of the vertical charge transfer device driving signal applied to the gate electrode 201 on a vertical charge transfer device 8 on the p-type impurity region 20 can be effectively made to be a negative voltage. The amount of the negative voltage becomes $|V_{SW}-V_{PW}|$.

Figure 3:
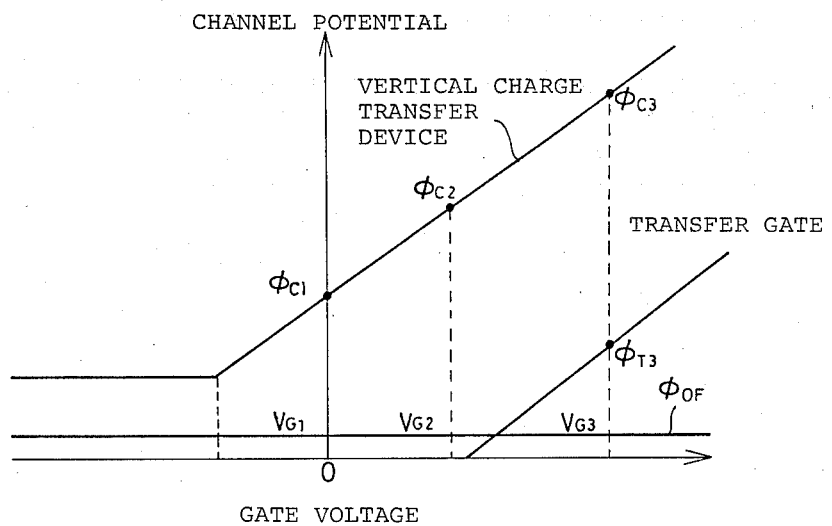
FIG. 3 is a diagram showing change in channel potential of a transfer gate and a vertical charge transfer device when the gate voltage is changed in the conventional CSD type solid-state image sensor having the structure shown in FIG. 2.

In FIG. 5, the voltage at a "L" level of a vertical charge transfer device driving signal with respect to the p-type impurity region 20 is not 0V but $V_{G1} = -|V_{SW}-V_{PW}|$. Thus, if the amplitude, $V_{G2}-V_{G1}$, of the voltage of the vertical charge transfer device driving signal shown in FIG. 5 is almost the same as that shown in FIG. 3, the amplitude, $\phi_{C2}-\phi_{C1}$, of the channel potential shown in FIG. 5 is almost the same as that shown in FIG. 3, so that the same vertical charge transfer characteristic as in a conventional solid-state image sensor can be obtained in this solid-state image sensor. Therefore, the voltage at an "H" level of the vertical charge transfer device driving signal, that is, voltage $V_{G2}$ at the time when vertical charge transfer is driven (FIG. 5) can be made smaller than that of the conventional solid-state image sensor (FIG. 3). It is required that a transfer gate 7 is not turned on until the gate voltage becomes $V_{G2}$. Therefore, it will be appreciated from the foregoing that the threshold voltage of the transfer gate 7 can be made lower than that of the transfer gate of the conventional solid-state image sensor. The amplitude of the voltage of the photodetector 101 generally depends on the amplitude of the potential in the region under the transfer gate 7. According to the present invention, voltage $V_{G3}$ of trnsfer gate selecting signal can be made smaller by reduced voltage of the threshold voltage of the transfer gate 7, so that the transfer gate can be driven at a low voltage. The amount of $-|V_{SW}-V_{PW}|$ is effective up to $V_{G0}$ in which the region under the gate electrode 201 in an n-type impurity region 3 of the vertical charge transfer device 8 is in a hole accumulation state.

Although an embodiment of a photodetector portion and a driver circuit portion including an n channel device is described, according to the present invention, the photodetector portion and the driver circuit portion may include a p channel device, in which case the same effect as the above described embodiment can be obtained.

Although an embodiment of a CSD type solid-state image sensor is described, according to the present invention, a solid-state image sensor may employ a standard CCD provided that a driver circuit portion is integrated thereon, in which case the same effect as the above described embodiment can be obtained.

Although an embodiment of a photodetector portion formed on a single p-type impurity region 20 is described, the photodetector portion may be formed on a plurality of p-type impurity regions. For example, a photodetector and an output preamplifier may be formed on separate p-type impurity regions.

Although the present invention has been described and illustrated in detail, it is clearly understood that the same is by way of illustration and example only and if not to be taken by way of limitation, the spirit and scope of the present invention being limited only by the terms of the appended claims

What is claimed is:

1. A solid-state image sensor comprising:
   a semiconductor substrate (10) of a first conductivity type,
   at least one first semiconductor region (20) of a second conductivity type opposite to said first conductivity type, formed on said semiconductor substrate,
   a photodetector portion (21) formed on said first semiconductor region, said photodetector portion including at least
   a plurality of photodetectors (101-103, 111-113, 121-123) arranged in row and column directions in a two-dimensional manner for detecting light and generating signal charges,
   a plurality of transfer gates arranged in row and column directions in a two-dimensional manner and connected to said photodetectors, respectively, for selectively reading out said signal charges from said photodetectors,
   a plurality of vertical charge transfer devices connected to each column of said transfer gates, respectively, for transferring said signal charges provided from said transfer gates, and a horizontal charge transfer device (500) connected to said vertical charge transfer devices for transferring said signal charges from said vertical charge transfer devices, second semiconductor regions (30, 40) of the second conductivity type formed on said semiconductor substrate, spaced apart from said first semiconductor region, driver circuit portions (700, 800) formed on said second semiconductor region for driving said transfer gates and said vertical charge transfer devices, first power supply means (50) for setting the potential in said first semiconductor region to a first potential, and second power supply means (60) for setting the potential in said second semiconductor region to a second potential having the same polarity as that of said first potential and an absolute value which is larger than that of said first potential.

2. A solid-state image sensor in accordance with claim 1, wherein
said driver circuit portion comprises a MOS circuit including a channel of a first conductivity type.

3. A solid-state image sensor in accordance with claim 1, wherein said driver circuit portion comprises:
a transfer gate selecting circuit (700) for generating a transfer gate selecting signal for selecting a predetermined transfer gate, and
a vertical charge transfer device driving circuit (800) for generating a vertical charge transfer device driving signal.

4. A solid-state image sensor in accordance with claim 3, wherein
each of said transfer gates and each of said vertical charge transfer devices comprise a common gate electrode (201-203, 211-213, 222-223) for receiving said transfer gate selecting signal and said vertical charge transfer device driving signal.

5. A solid-state image sensor in accordance with claim 4, wherein
with respect to a third potential, which is a reference potential, displaced from the ground potential by an absolute value of difference between said first potential and said second potential, said vertical charge transfer device driving signal fluctuates with a first amplitude in a direction opposite to said displacement direction, and
said transfer gate selecting signal fluctuates with a second amplitude which is larger than said first amplitude, with respect to said third potential, which is a reference potential.

6. A solid-state image sensor in accordance with claim 4, wherein
each of said transfer gates includes an impurity region (4) having a high concentration of the second conductivity type, formed under said common gate electrode.

7. A solid-state image sensor in accordance with claim 4, wherein
each of said vertical charge transfer devices includes an impurity region (3) of the first conductivity type, formed under said common gate electrode.

8. A solid-state image sensor in accordance with claim 1, wherein said photodetector portion further comprises:
a plurality of storage gates (300, 310, 320) linearly arranged and connected to said vertical charge transfer devices, respectively, for temporarily storing said signal charges from said vertical charge transfer devices, and
a plurality of storage control gates (400, 410, 420) linearly arranged and connected to said storage gates and said horizontal charge transfer device for controlling transfer of said signal charges from said storage gates to said horizontal charge transfer device.

9. A solid-state image sensor in accordance with claim 1, wherein
said photodetector portion further comprises an output preamplifier (600) connected to said horizontal charge transfer device.

* * * * *